(12) United States Patent
Damle et al.

(10) Patent No.: US 10,153,015 B2
(45) Date of Patent: *Dec. 11, 2018

(54) MANAGING DISTURBANCE INDUCED ERRORS

(71) Applicant: Intel Corporation, Santa Clara, CA (US)

(72) Inventors: Prashant S. Damle, Santa Clara, CA (US); Frank T. Hady, Portland, OR (US); Paul D. Ruby, Folsom, CA (US); Kiran Pangal, Fremont, CA (US); Sowmiya Jayachandran, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 7 days.

This patent is subject to a terminal disclaimer.

(21) Appl. No.: 15/703,589

(22) Filed: Sep. 13, 2017

(65) Prior Publication Data

US 2018/0068695 A1 Mar. 8, 2018

Related U.S. Application Data

(63) Continuation of application No. 14/938,221, filed on Nov. 11, 2015, now Pat. No. 9,792,963, which is a continuation of application No. 13/832,278, filed on Mar. 15, 2013, now Pat. No. 9,202,547.

(51) Int. Cl.
*G11C 7/10* (2006.01)
*G11C 11/406* (2006.01)
*G11C 16/34* (2006.01)

(52) U.S. Cl.
CPC .......... *G11C 7/1072* (2013.01); *G11C 11/406* (2013.01); *G11C 11/40618* (2013.01); *G11C 16/3431* (2013.01)

(58) Field of Classification Search
CPC . G11C 11/406; G11C 16/3431; G11C 7/1072; G11C 11/40618; G06F 12/0246; G06F 12/0253
See application file for complete search history.

(56) References Cited

U.S. PATENT DOCUMENTS

| | | | |
|---|---|---|---|
| 9,087,602 B2 | 7/2015 | Youn et al. | |
| 9,202,547 B2 | 12/2015 | Damle et al. | |
| 9,202,963 B2 * | 12/2015 | Liu | .................. H01L 27/14618 |

(Continued)

OTHER PUBLICATIONS

Notice of Allowance for U.S. Appl. No. 13/832,278, dated Jul. 31, 2015, 7 pages.

(Continued)

*Primary Examiner* — Hiep T Nguyen
(74) *Attorney, Agent, or Firm* — Compass IP Law PC

(57) ABSTRACT

In an embodiment, a memory controller may determine that one or more neighboring memory cells associated with a target memory cell in a memory device are to be refreshed. The controller may generate a command associated with refreshing the one or more neighboring memory cells. The controller may transfer the command from the memory controller to the memory device containing the target memory cell. The command may direct the memory device to refresh the neighboring memory cells and/or return one or more addresses associated with the neighboring memory cells.

28 Claims, 8 Drawing Sheets

(56) References Cited

U.S. PATENT DOCUMENTS

| | | |
|---|---|---|
| 9,792,963 B2 * | 10/2017 | Damle .................. G11C 7/1072 |
| 2004/0052142 A1 | 3/2004 | Ikehashi et al. |
| 2007/0058427 A1 | 3/2007 | Okhonin et al. |
| 2009/0213675 A1 | 8/2009 | Shino |
| 2013/0268727 A1 | 10/2013 | Sohn et al. |
| 2014/0006703 A1 | 1/2014 | Bains et al. |
| 2014/0063994 A1 * | 3/2014 | Song ........................ G11C 8/14 |
| | | 365/200 |
| 2014/0063995 A1 | 3/2014 | Song |
| 2014/0078845 A1 | 3/2014 | Song |
| 2014/0146624 A1 | 5/2014 | Son et al. |
| 2015/0085563 A1 | 3/2015 | Yoon |
| 2015/0120999 A1 | 4/2015 | Kim et al. |
| 2015/0213877 A1 | 7/2015 | Darel |
| 2015/0294711 A1 | 10/2015 | Gaither et al. |

OTHER PUBLICATIONS

Notice of Allowance for U.S. Appl. No. 14/938,221, dated Jun. 5, 2017, 7 pages.
Office Action for U.S. Appl. No. 13/832,278, dated Jan. 30, 2015, 6 pages.
Office Action for U.S. Appl. No. 14/938,221, dated Jun. 6, 2016, 5 pages.
Office Action for U.S. Appl. No. 14/938,221, dated Nov. 29, 2016, 6 pages.

* cited by examiner

MANAGING DISTURBANCE INDUCED ERRORS

RELATED APPLICATIONS

This application is a continuation of U.S. patent application Ser. No. 14/938,221 entitled "MANAGING DISTURBANCE INDUCED ERRORS" filed on Nov. 11, 2015, which further claims the benefit of U.S. patent application Ser. No. 13/832,278 entitled "MANAGING DISTURBANCE INDUCED ERRORS" filed on Mar. 15, 2013, the entire contents of which are incorporated herein by reference.

BACKGROUND

A computing device may use one or more storage systems to store information. The information may include, for example, data and/or executable instructions. The storage systems may include a primary storage and a secondary storage. A primary storage may be a storage that is directly accessible to a processor that may be contained in the computing device. The processor may access the primary storage via a memory bus that may contain provisions for transferring information between the processor and the primary storage. A secondary storage may be a storage that may not be directly accessible to the processor. Here, information may be transferred between the processor and the secondary storage via one or more input/output (I/O) channels that may be part of an I/O bus.

BRIEF DESCRIPTION OF THE DRAWINGS

The accompanying drawings, which are incorporated in and constitute a part of this specification, illustrate one or more embodiments described herein and, together with the description, explain these embodiments. In the drawings.

DETAILED DESCRIPTION

Figure 1:
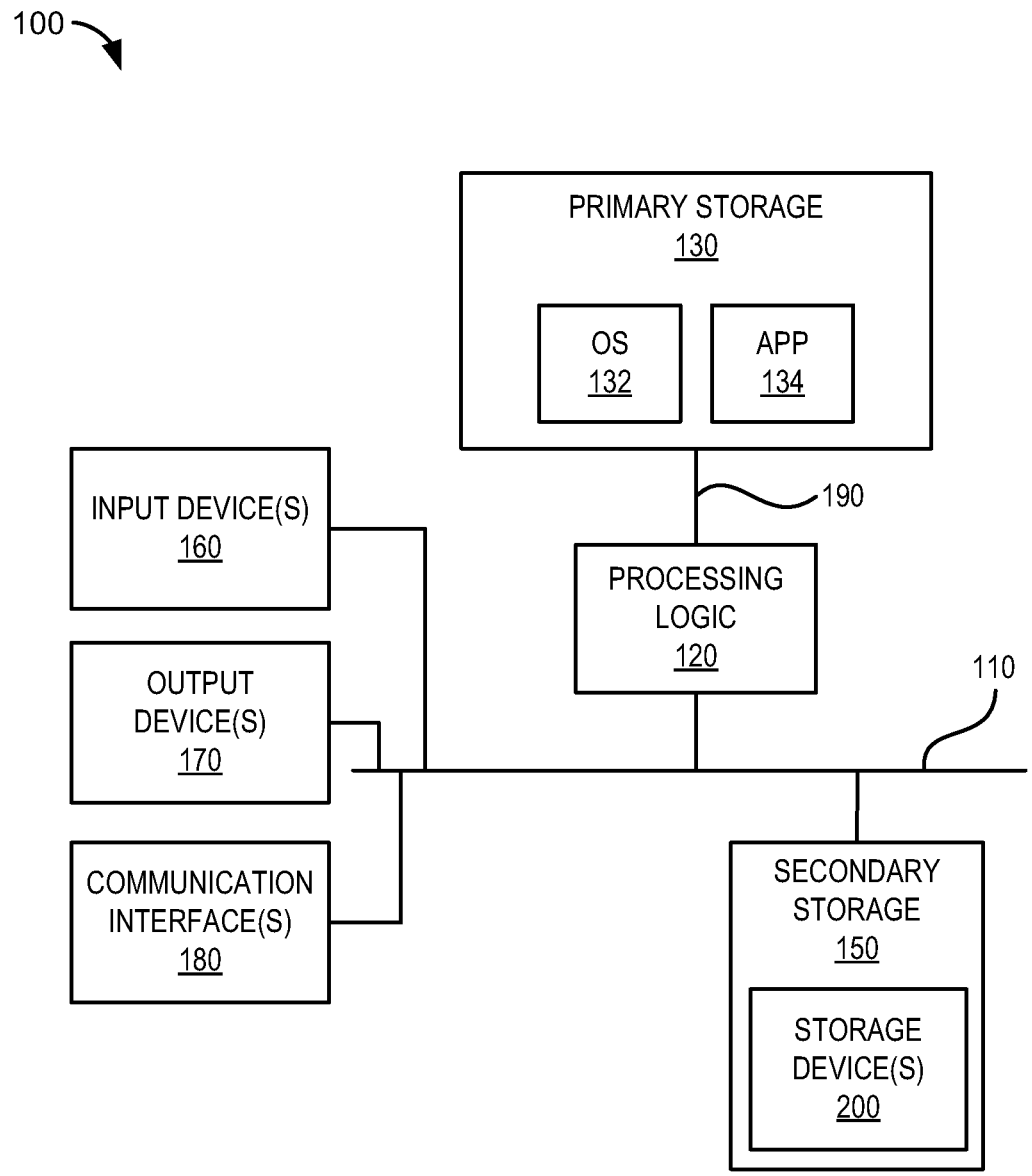
FIG. 1 illustrates a block diagram of an example embodiment of a computing device.

The following detailed description refers to the accompanying drawings. The same reference numbers in different drawings may identify the same or similar elements. Also, the following detailed description does not limit the invention.

A computing device may include a storage device that the computing device may use to store information (e.g., data, computer-executable instructions). The storage device may store the information in a volatile and/or non-volatile storage. A non-volatile storage may be used to store information that is to survive after power is lost to the computing device. For example, a computing device may contain a processor and a solid-state disk (SSD). The SSD may provide storage (e.g., non-volatile storage) for the computing device. The processor may use the SSD to store information for a user of the computing device. The information may include, for example, data and/or applications that may be used by the computer device. By storing the information in the SSD, the information may be persisted such that the information may be retained in the SSD after power is lost to the computing device. The processor may retrieve the persisted information from the SSD after power is restored to the computing device.

A storage device may contain one or more memory devices that may store information for the storage device. A memory device may comprise one or more arrays where an array may include one or more memory cells that may be used to store information in the memory device.

A memory cell may be associated with an address. The address may be used to specify a location of the memory cell in an array. Information may be written into and/or read from the memory cell using the address associated with the memory cell. For example, a memory cell in a memory device may be associated with a particular address (e.g., 0x100). The memory cell may be accessed (e.g., read, written) using the address of the memory cell.

In some memory devices, an address may be associated with a group of one or more memory cells. For example, a memory device may be byte addressable where an address may be associated with eight memory cells. Here, a memory cell may store one bit of information.

In some memory devices, arrays of memory cells may be organized in multiple dimensions (e.g., a 2-dimensional (2D) arrays, 3-dimensional (3D) arrays). Here, a group of memory cells associated with an address may physically reside across multiple arrays. In other words, a memory address may be associated with a combination of multiple memory cells from multiple arrays.

A target memory cell may be a memory cell that is a target for an operation that may involve accessing the memory cell. An address associated with the target memory cell may be used to identify the target memory cell. For example, suppose a computing device issues a read command to a storage device to read information stored at an address in the storage device. The storage device may include one or more memory devices that may contain one or more memory cells associated with the address that may store the information. The storage may use the address to identify the one or more memory cells and read the information from the identified memory cells. In this example, the identified memory cells may be said to be target memory cells for the read operation.

A target memory cell may be associated with one or more neighboring memory cells. A neighboring memory cell may include a memory cell that may be physically near the target memory cell. In some instances, accesses to a target cell may disturb (e.g., change) information stored at a neighboring memory cell. Such disturbances may be referred to as "disturbs".

A system that employs one or more memory devices to store information may utilize one or more techniques in order to obviate one or more effects that may be associated with disturbs. Examples of techniques that may be used may include: (1) improving materials, process, and/or technology used to implement the memory devices in order to minimize disturbs; (2) changing various read and/or write techniques utilized by in a memory device (e.g., changing voltages applied to a target memory cell versus other memory cells, changing a timing and/or order in which voltages are applied); (3) designing a controller that interfaces with a memory device to periodically refresh information (e.g., data) stored in the memory device and/or refresh the information after certain number of read and/or write operations performed on the memory device; and/or (4) designing error correction circuitry associated with a controller to correct an increased number of errors.

Note that the above techniques may be implemented entirely within a memory device or within a controller associated with a memory device. Other techniques that may be used to obviate one or more effects associated with disturbs may involve a memory device and a controller associated with the memory device.

Techniques described herein may be employed in a computing device. Examples of computing devices that may employ techniques described herein may include, but are not limited to, smart phones, tablets, ultrabooks, laptops, mainframes, servers, and desktop computers.

FIG. 1 illustrates a block diagram of an example embodiment of a computing device 100 that may employ various techniques described herein. Referring to FIG. 1, computing device 100 may include various components such as, for example, processing logic 120, primary storage 130, secondary storage 150, one or more input devices 160, one or more output devices 170, and/or one or more communication interfaces 180.

It should be noted that FIG. 1 illustrates an example embodiment of computing device 100. Other embodiments of computing device 100 may include more components or fewer components than the components illustrated in FIG. 1. Further, the components may be arranged differently than as illustrated in FIG. 1. For example, in an embodiment of computing device 100, secondary storage 150 may be contained at a remote site that provides "cloud" storage. The site may be accessible to computing device 100 via a communications network, such as, for example, the Internet. A communication interface 180 may be used to interface the computing device 100 with the communications network.

Also, it should be noted that functions performed by various components contained in other embodiments of computing device 100 may be distributed among the components differently than as described herein.

Computing device 100 may include an input/output (I/O) bus 110 that may enable communication among components in computing device 100, such as, for example, processing logic 120, secondary storage 150, one or more input devices 160, one or more output devices 170, and/or one or more communication interfaces 180. The communication may include, among other things, transferring, for example, control signals and/or data between the components. I/O busses that may be used to implement I/O bus 110 may include, for example, serial AT attachment (SATA), peripheral component interconnect (PCI), PCI express (PCI-e), universal serial bus (USB), small computer system interface (SCSI), serial attached SCSI (SAS), or some other I/O bus.

Computing device 100 may include a memory bus 190 that may enable information, which may be stored in primary storage 130, to be transferred between processing logic 120 and primary storage 130. The information may include computer-executable instructions and/or data that may be executed, manipulated, and/or otherwise processed by processing logic 120.

Processing logic 120 may include logic for interpreting, executing, and/or otherwise processing information. The information may include information that may be stored in, for example, primary storage 130 and/or secondary storage 150. In addition, the information may include information that may be acquired (e.g., read, received) by one or more input devices 160 and/or communication interfaces 180.

Processing logic 120 may include a variety of heterogeneous hardware. For example, the hardware may include some combination of one or more processors, microprocessors, field programmable gate arrays (FPGAs), application specific instruction set processors (ASIPs), application specific integrated circuits (ASICs), complex programmable logic devices (CPLDs), graphics processing units (GPUs), and/or other types of processing logic that may, for example, interpret, execute, manipulate, and/or otherwise process the information. Processing logic 120 may comprise a single core or multiple cores. An example of a processor that may be used to implement processing logic 120 is the Intel® Core™ i7 processor available from Intel Corporation, Santa Clara, Calif.

Input devices 160 may include one or more devices that may be used to input information into computing device 100. The devices may include, for example, a keyboard, computer mouse, microphone, camera, trackball, gyroscopic device (e.g., gyroscope), mini-mouse, touch pad, stylus, graphics tablet, touch screen, joystick (isotonic or isometric), pointing stick, accelerometer, palm mouse, foot mouse, puck, eyeball controlled device, finger mouse, light pen, light gun, neural device, eye tracking device, steering wheel, yoke, jog dial, space ball, directional pad, dance pad, soap mouse, haptic device, tactile device, neural device, multipoint input device, discrete pointing device, and/or some other input device. The information may include spatial (e.g., continuous, multi-dimensional) data that may be input into computing device 100 using, for example, a pointing device, such as a computer mouse. The information may also include other forms of data, such as, for example, text that may be input using a keyboard.

Output devices 170 may include one or more devices that may output information from computing device 100. The devices may include, for example, a cathode ray tube (CRT), plasma display device, light-emitting diode (LED) display device, liquid crystal display (LCD) device, vacuum florescent display (VFD) device, surface-conduction electron-emitter display (SED) device, field emission display (FED) device, haptic device, tactile device, printer, speaker, video projector, volumetric display device, plotter, touch screen, and/or some other output device. Output devices 170 may be directed by, for example, processing logic 120, to output the information from computing device 100. Outputting the information may include presenting (e.g., displaying, printing) the information on an output device 170. The information may include, for example, text, graphical user interface (GUI) elements (e.g., windows, widgets, and/or other GUI elements), audio (e.g., music, sounds), and/or other information that may be outputted by output devices 170.

Communication interfaces 180 may include logic for interfacing computing device 100 with, for example, one or more communications networks and enable computing device 100 to communicate with one or more entities (e.g., nodes) coupled to the communications networks. The communications networks may include, for example, the Internet, wide-area networks (WANs), local area networks (LANs), 3G and/or 4G (e.g., 4G long-term evolution (LTE)) networks. Communication interfaces 180 may include one or more transceiver-like mechanisms that may enable computing device 100 to communicate with entities coupled to the communications networks. Examples of communication interfaces 180 may include a built-in network adapter, network interface card (NIC), Personal Computer Memory Card International Association (PCMCIA) network card, card bus network adapter, wireless network adapter, Universal Serial Bus (USB) network adapter, modem, and/or other device suitable for interfacing computing device 100 to a communications network.

Primary storage 130 and secondary storage 150 may include one or memory devices. A memory device may support, for example, serial or random access to information contained in the memory device. A memory device that supports serial access to information stored in the memory device may be referred to as a serial memory device. A memory device that supports random access to information stored in the memory device may be referred to as a random access memory (RAM) device.

A memory device may be, for example, a volatile or non-volatile memory device. A volatile memory device may be a memory device that may lose information stored in the device when power is removed from the device. A non-volatile memory device may be a memory device that may retain information stored in the device when power is removed from the device. Examples of memory devices may include dynamic RAM (DRAM) devices, flash memory devices, static RAM (SRAM) devices, zero-capacitor RAM (ZRAM) devices, twin transistor RAM (TTRAM) devices, read-only memory (ROM) devices, ferroelectric transistor RAM (FeTRAM) devices, magneto-resistive RAM (MRAM) devices, three dimensional (3D) cross point memory devices (e.g., phase change memory (PCM) devices), nanowire-based devices, resistive RAM (RRAM) devices, serial electrically erasable programmable ROM (SEEPROM) devices, spin transfer torque (STT) MRAM devices, and serial flash devices.

Primary storage 130 may be accessible to processing logic 120 via memory bus 190. Primary storage 130 may store computer-executable instructions and/or data that may implement operating system (OS) 132 and application (APP) 134. The computer-executable instructions may be executed, interpreted, and/or otherwise processed by processing logic 120.

Primary storage 130 may be implemented using one or more memory devices that may store information for processing logic 120. The information may include executable instructions that may be executed by processing logic 120. The information may also include data that may be manipulated by processing logic 120. The memory devices may include volatile and/or non-volatile memory devices.

OS 132 may be a conventional operating system that may implement various conventional operating system functions that may include, for example, (1) scheduling one or more portions of APP 134 to run on (e.g., be executed by) the processing logic 120, (2) managing primary storage 130, and (3) controlling access to various components in computing device 100 (e.g., input devices 160, output devices 170, communication interfaces 180, secondary storage 150) and information received and/or transmitted by these components.

Examples of operating systems that may be used to implement OS 132 may include the Linux operating system, Microsoft Windows operating system, the Symbian operating system, Mac OS operating system, and the Android operating system. A distribution of the Linux operating system that may be used is Red Hat Linux available from Red Hat Corporation, Raleigh, N.C. Versions of the Microsoft Windows operating system that may be used include Microsoft Windows Mobile, Microsoft Windows 8, Microsoft Windows 7, Microsoft Windows Vista, and Microsoft Windows XP operating systems available from Microsoft Inc., Redmond, Wash. The Symbian operating system is available from Accenture PLC, Dublin, Ireland. The Mac OS operating system is available from Apple, Inc., Cupertino, Calif. The Android operating system is available from Google, Inc., Menlo Park, Calif.

APP 134 may be a software application that may execute under control of OS 132 on computing device 100. APP 134 and/or OS 132 may contain provisions for processing transactions that may involve storing information in secondary storage 150. These provisions may be implemented using data and/or computer-executable instructions contained in APP 134 and/or OS 132.

Secondary storage 150 may include one or more storage devices 200. The storage devices 200 may be accessible to processing logic 120 via I/O bus 110. The storage devices may store information. The information may include computer-executable instructions and/or data. The information may be executed, interpreted, manipulated, and/or otherwise processed by processing logic 120.

The storage devices 200 may be volatile or non-volatile. Examples of storage devices 200 may include magnetic disk drives, optical disk drives, random-access memory (RAM) disk drives, flash drives, SSDs, and/or hybrid drives. The information may be stored on one or more non-transitory tangible computer-readable media contained in the storage devices 200. Examples of non-transitory tangible computer-readable media that may be contained in the storage devices may include magnetic discs, optical discs, volatile memory devices, and or non-volatile memory devices.

Figure 2:
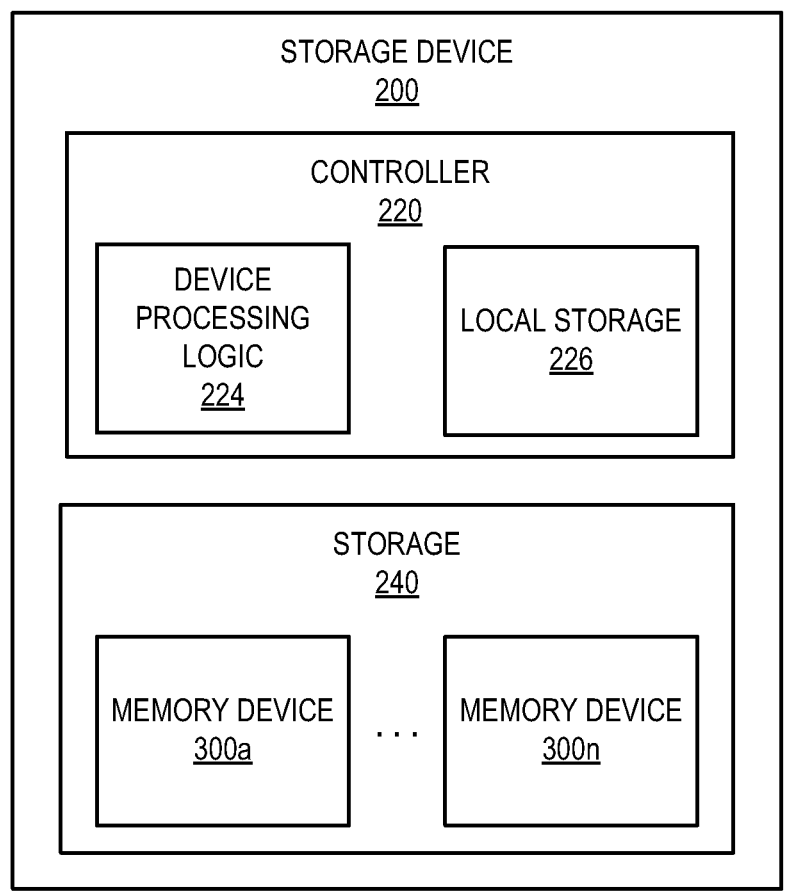
FIG. 2 illustrates an example embodiment of a storage device that may be contained in a secondary storage.

FIG. 2 illustrates an example embodiment of a storage device 200. Storage device 200 may be, for example, an SSD. Referring to FIG. 2, storage device 200 may include a controller 220 and storage 240.

Controller 220 may be a memory controller that may control and/or manage an operation of storage 240 and/or storage device 200. Controller 220 may interface with storage 240 and transfer information between contained in storage 240 and the controller 220. The information may include commands that controller 220 may use to manage and/or control an operation of storage 240. The information may also include data and/or address information. The address information may relate to locations of memory cells that may be contained in memory devices 300*a-n*. Controller 220 may employ various protocols, control signals, handshake signals, status signals, and/or other techniques to accommodate transferring the information between the controller 220, storage 240, and/or memory devices 300*a-n*.

Controller 220 may include device processing logic 224 and local storage 226. Device processing logic 224 may include processing logic that may be used to, for example, refresh memory cells contained in storage 240. The processing logic may include some combination of one or more processors, microprocessors, FPGAs, ASIPs, ASICs, CPLDs, and/or other types of processing logic that may, for example, interpret, execute, manipulate, and/or otherwise process the information.

Local storage 226 may include a non-transitory tangible computer-readable medium that may be used to store information that may be processed by device processing logic 224. The medium may include volatile and/or non-volatile storage. The information may include computer-executable instructions that may, for example, be executed by device processing logic 224 to refresh one or more memory cells contained in storage 240 and/or perform other functions and/or operations that may be associated with storage 240 and/or storage device 200.

For example, acts associated with FIGS. 5-8 (described further below) may be encoded in one or more computer-executable instructions that may be stored in local storage 226. Device processing logic 224 may perform one or more of the acts by executing one or more of the computer-executable instructions.

Storage 240 may provide a volatile and/or non-volatile storage for information written to the storage device 200. Storage 240 may contain one or more memory devices 300a-n that may be used to store the information. Examples of devices that may be used to implement memory device 300 may include DRAM devices, flash memory devices, SRAM devices, ZRAM devices, TTRAM devices, ROM devices, FeTRAM devices, MRAM devices, 3D cross point memory devices (e.g., PCM devices), nanowire-based devices, RRAM devices, SEEPROM devices, and serial flash devices.

A memory device 300 may store information in one or more memory cells contained in the memory device 300. The memory cells may be organized as an array which may be multi-dimensional (e.g., 2-dimensional array, 3-dimensional array). Further, groups of one or more memory cells may be associated with addresses.

For example, a memory cell in memory device 300 may store a single bit of information. Memory device 300 may be byte addressable such that an address may be associated with a group of eight memory cells contained in memory device 300.

Figure 3:
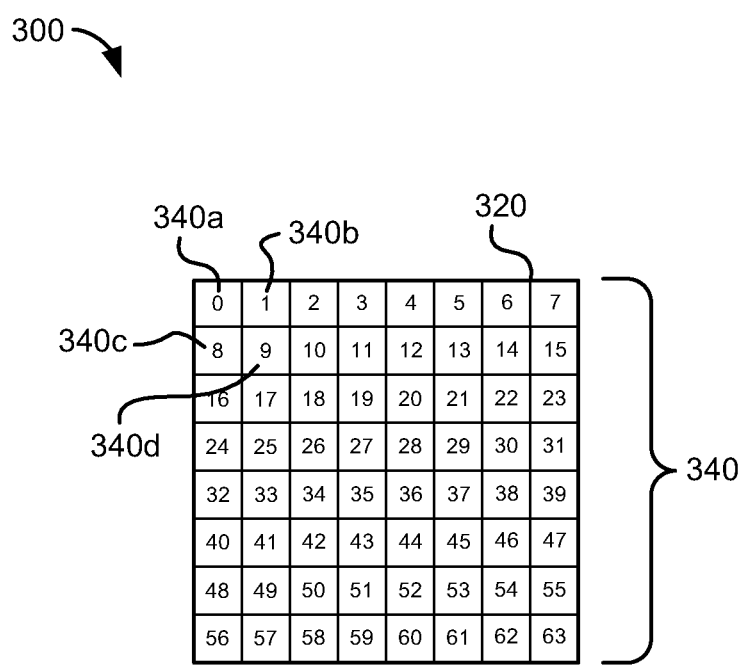
FIG. 3 illustrates an example layout of a memory device that may be contained in a storage device.

FIG. 3 illustrates an example layout of memory device 300. Referring to FIG. 3, memory device 300 may include an array 320 of memory cells 340. It should be noted that FIG. 3 illustrates an example layout of a memory device 300. Other embodiments of memory device 300 may include other layouts. For example, other embodiments of memory device 300 may contain layouts that may include multiple arrays 320.

A memory cell 340 may store information (e.g., a bit of information). Further, memory cell 340 may be associated with an address that may be used to access (e.g., read, write) information in the memory cell 340. For example, memory cell 340a may be associated win an address "0". Information may be read from or written to memory cell 340a using address "0".

A memory cell in array 320 may contain neighboring memory cells. For example, memory cells 340b-d may be considered neighboring memory cells that may be associated with memory cell 340.

Memory cell disturbs may be obviated, for example, by refreshing contents of memory cells that may be affected (e.g., changed) due to disturbs. For example, suppose a neighboring memory cell may be disturbed due to multiple accesses to an associated target memory cell. This situation may be obviated by periodically refreshing the neighboring memory cell.

Figure 4:
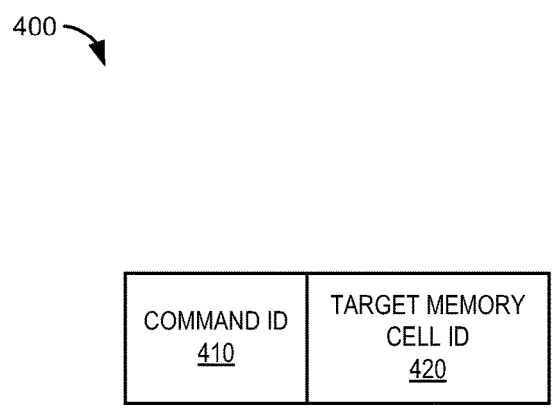
FIG. 4 illustrates an example embodiment of a command that may be issued to a memory device.

Techniques that may be used to identify and/or refresh neighboring memory cells associated with a target memory cell may involve a command. FIG. 4 illustrates an example command 400 that may be used to identify and/or refresh neighboring memory cells that may be associated with a target memory cell.

Referring to FIG. 4, command 400 may include a command identifier (ID) field 410 and target memory cell ID field 420. The command ID field 410 may hold an identifier that may identify a command to be performed. The target memory cell ID field 420 may hold an identifier that may be associated with a target memory cell and may be used to identify the target memory cell. For example, the identifier may include an address associated with the target memory cell. The address may be used to identify the target memory cell.

The command 400 may be used by a controller to identify addresses associated with neighboring memory cells of a target memory cell. For example, suppose controller 220 (FIG. 2) generates a command 400 where the target memory cell ID field 420 includes an address of a target memory cell in memory device 300a and command ID field 410 that includes an identifier that identifies a command that requests addresses of neighboring memory cells associated with the target memory cell. Controller 220 (FIG. 2) may issue the command 400 to memory device 300a. Memory device 300a may acquire (e.g., read, receive) the command and process it. Processing may include transferring addresses of one or more of the neighboring memory cells to the controller 220.

In another example, controller 220 may generate a command 400 that includes a an address of a target memory cell in the target memory cell ID field 420 and an identifier associated with a command to refresh neighboring memory cells associated with the target memory cell in the command ID field 410. Controller 220 may issue the command to memory device 300a. Memory device 300 may acquire the command 400 and process it. Processing the command 400 may include, for example, identifying neighboring memory cells associated with the target memory cell and/or refreshing the identified neighboring memory cells.

Figure 5:
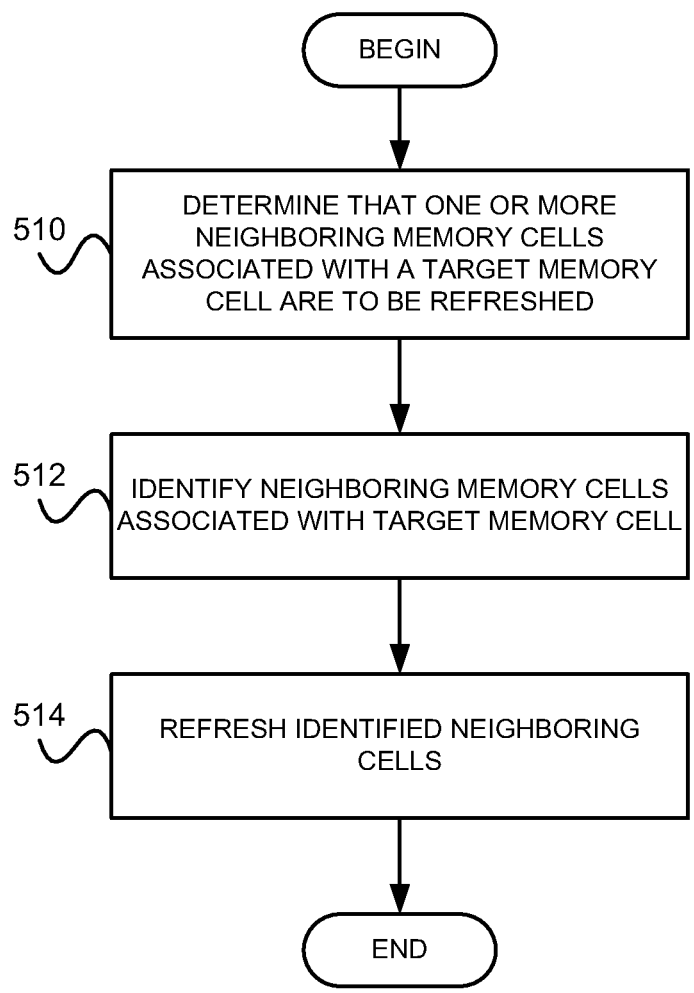
FIGS. 5-8 illustrate flow diagrams of example acts that may be used to refresh one or more neighboring memory cells associated with a target memory cell contained in a memory device.

FIG. 5 illustrates a flow diagram of example acts that may be used to refresh one or more neighboring memory cells associated with a target memory cell. Referring to FIG. 5, at block 510, a determination may be performed and based on an outcome of the determination it may be determined that one or more neighboring cells associated with a target memory cell are to be refreshed. The determination may involve various techniques.

For example, a technique may involve generating a random number for one or more accesses (e.g., each access) of the target memory cell. The determination may involve determining whether the generated random number matches certain criteria (e.g., the random number equals a predetermined value). If the generated random number matches the criteria, it may be determined that the neighboring memory cells associated with the target memory cell are to be refreshed.

In another example, a technique may involve a count associated with a target memory cell (e.g., a count of a number of times the target memory cell is accessed). A refresh may occur when, for example, the count matches a certain criteria.

For example, a count that measures a number of times the target memory cell is accessed may be maintained. A check may be performed to determine whether the count has reached a predetermined value (e.g., a predetermined threshold value, an integer multiple of a predetermined number). After the count reaches the predetermined value it may be determined that the neighboring memory cells associated with the target memory cell are to be refreshed.

At block 512, one or more neighboring memory cells associated with the target memory cell are identified. The neighboring memory cells may be identified, for example, by the memory device and/or the controller.

For example, a command containing an identifier that identifies the target memory cell may be sent to a memory device containing the target memory cell. The command may direct the memory device to refresh the neighboring memory cells. The memory device may identify the neighboring memory cells using the identifier in the command.

In another example, a command containing an identifier that identifies the target memory cell may be sent to the memory device containing the target memory cell. Here, the command may direct the memory device to return one or more addresses of the neighboring memory cells. The neighboring memory cells may be identified based on the returned addresses.

It should be noted that the above techniques for identifying neighboring memory cells are examples of techniques that may be used to identify neighboring memory cells. Other techniques for identifying the neighboring memory cells may also be used.

At block 514, the identified neighboring memory cells are refreshed. Refreshing a neighboring memory cell may include rewriting the neighboring memory cell with information that is stored in the neighboring memory cell. For example, suppose the neighboring memory cell is storing a bit set to a logical one. Refreshing the neighboring memory cell may include writing a logical one to the neighboring memory cell.

Note that refreshing may include utilizing various features that may be associated with a memory device containing the neighboring memory cells. For example, the memory device may support an "internal read with no data burst" and/or a "reset only write" features. These features may be used when refreshing the neighboring memory cells.

For example, suppose that the target memory cell and neighboring memory cells are contained in memory device 300*a*. Controller 220 may determine that one or more of the neighboring memory cells are to be refreshed. The determination may be performed using one or more of the above-described techniques. The controller 220 may generate a command 400 associated with refreshing the neighboring memory cells.

The command 400 may include, for example, a command that may direct memory device 300*a* to (1) refresh the neighboring memory cells and/or (2) return one or more addresses associated with neighboring memory cells. After generating the command 400, controller 220 may transfer the command to memory device 300*a*. Memory device 300*a* may receive the command 400 and process it. Processing the command 400 may include, for example, refreshing the neighboring memory cells and/or returning one or more addresses associated with the neighboring memory cells. If the memory device 300*a* returns one or more addresses associated with the neighboring memory cells, the controller 220 may receive the addresses and refresh the neighboring memory cells, such as described above, using the received addresses.

Figure 6:
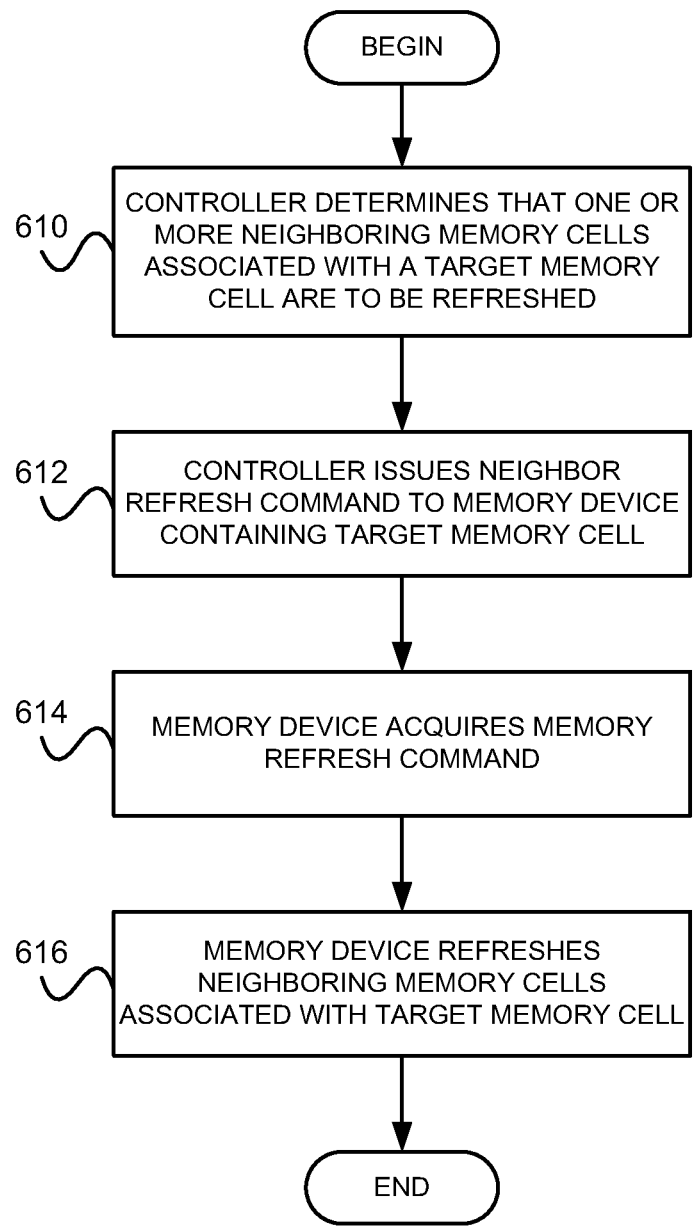

FIG. 6 illustrates another flow diagram of example acts that may be used to refresh one or more neighboring memory cells associated with a target memory cell. Referring to FIG. 6, at block 610, a controller may determine that neighboring memory cells associated with a target memory cell are to be refreshed. The controller may make the determination using various techniques, such as described above.

For example, suppose the target memory cell is contained in memory device 300*a*. Controller 220 may use one or more techniques to determine whether neighboring memory cells associated with the target memory cell should be refreshed. The techniques may include one or more of the techniques described above. Based on an outcome of the techniques, the controller 220 may determine that the neighboring memory cells should be refreshed.

At block 612, the controller may issue a neighbor refresh command to a memory device that contains the target memory cell. The neighbor refresh command may be used to direct the memory device to refresh neighboring memory cells associated with the target memory cell.

For example, continuing the above example, controller 220 may generate a command 400 (FIG. 4) that contains an identifier that identifies a neighbor refresh command in command ID field 410 and an address associated with the target memory cell (in memory device 300*a*) in the target memory cell ID field 420. After generating the command 400, controller 220 may issue the generated command 400. Issuing the command may include transferring (e.g., sending) the command 400 to memory device 300*a*. The controller 220 may transfer the command to the memory device 300*a* via, for example, a bus that may interconnect the controller 220 with the memory device 300*a*.

At block 614, the memory device may acquire the memory refresh command. For example, continuing the above example, memory device 300*a* may acquire the command 400 by reading the command from the bus.

At block 616, the memory device containing the target memory cell refreshes one or more neighboring memory cells associated with the target memory cell. Refreshing may include identifying the neighboring memory cells and rewriting information contained in the neighboring cells, such as described above.

For example, continuing the above example, suppose memory device 300*a* acquired the command 400 and processes it. Processing may include device processing logic 224 examining the target memory cell ID field 420 to identify the target memory cell. After identifying the target memory cell, device processing logic 224 may identify one or more neighboring memory cells associated with the identified target memory cell. Memory device 300*a* may then refresh information stored in the identified neighboring memory cells, such as described above.

Figure 7:
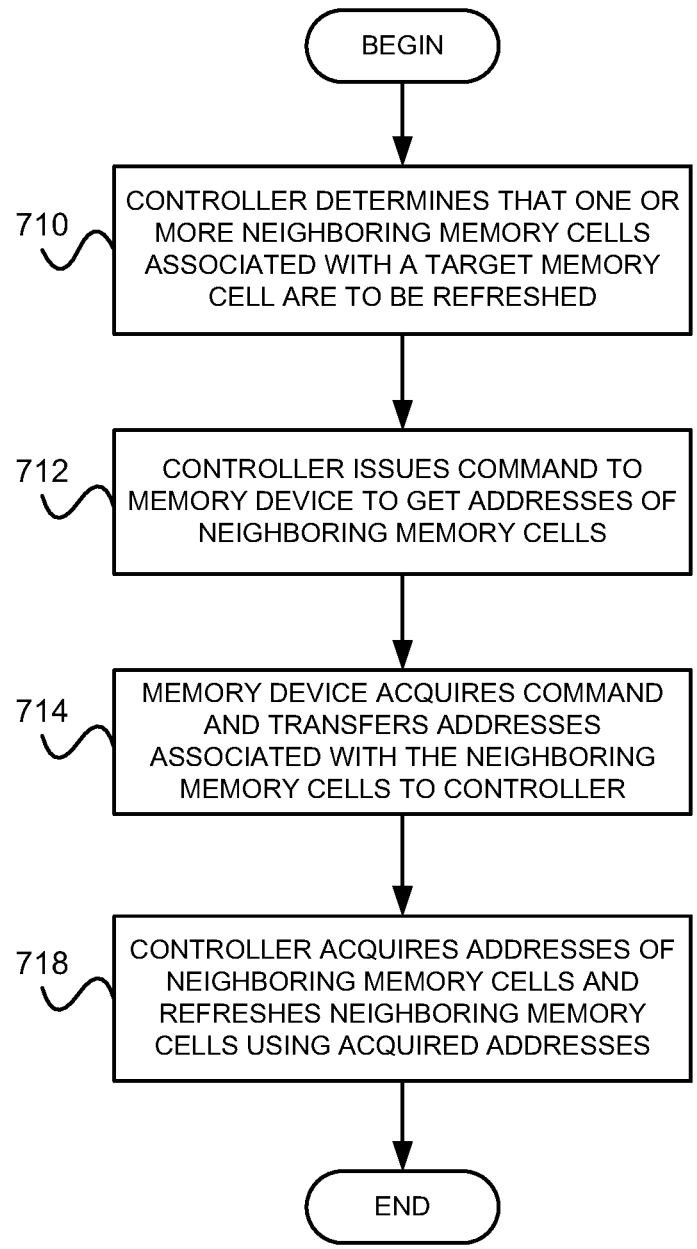

FIG. 7 illustrates another flow diagram of example acts that may be used to refresh one or more neighboring memory cells associated with a target memory cell. Referring to FIG. 7, at block 710, a controller may determine that neighboring memory cells associated with a target memory cell are to be refreshed. The controller may make the determination using various techniques, such as described above.

At block 712, the controller may issue a command to a memory device containing the target memory cell to get one or more addresses of neighboring memory cells associated with the memory device. For example, suppose memory device 300*a* contains the target memory cell. Controller 220 may generate a command 400 that contains an identifier that identifies a neighbor refresh command in command ID field 410 and an address associated with the target memory cell in the target memory cell ID field 420. Controller 220 may transfer the generated command 400 to memory device 300*a*.

At block 714, the memory device acquires the command and transfers one or more addresses associated with the neighboring memory cells to the controller. For example, continuing the above example, controller 220 may transfer the generated command 400 to memory device 300*a* via a bus. Memory device 300*a* may read the command 400 from the bus.

After reading the command 400, memory device 300*a* may process it. Processing the command may include identifying one or more addresses associated with the neighboring memory cells. The neighboring memory cells may be identified based on a technique that the memory device 300*a* may employ to identify neighboring memory cells. The technique may involve, for example, calculating the addresses of the neighboring memory cells using an algorithm.

After identifying the addresses of the neighboring memory cells, memory device 300a may transfer the identified addresses to the controller 220. Transferring may include, for example, messaging, handshaking, various protocols, and/or other techniques that may be used to transfer the identified addresses between the memory device 300a and the controller 220.

At block 718, the controller acquires addresses of neighboring memory cells and refreshes the neighboring memory cells associated with the target memory cell using the acquired addresses. For example, continuing the above example, suppose that memory device 300a transfers the addresses, identified at block 714, to controller 220 via a bus. Controller 220 may acquire the identified addresses by reading the addresses from the bus. After acquiring an address, controller 220 may refresh a memory cell associated with the address by, for example, rewriting information stored in the memory cell, such as described above.

Figure 8:
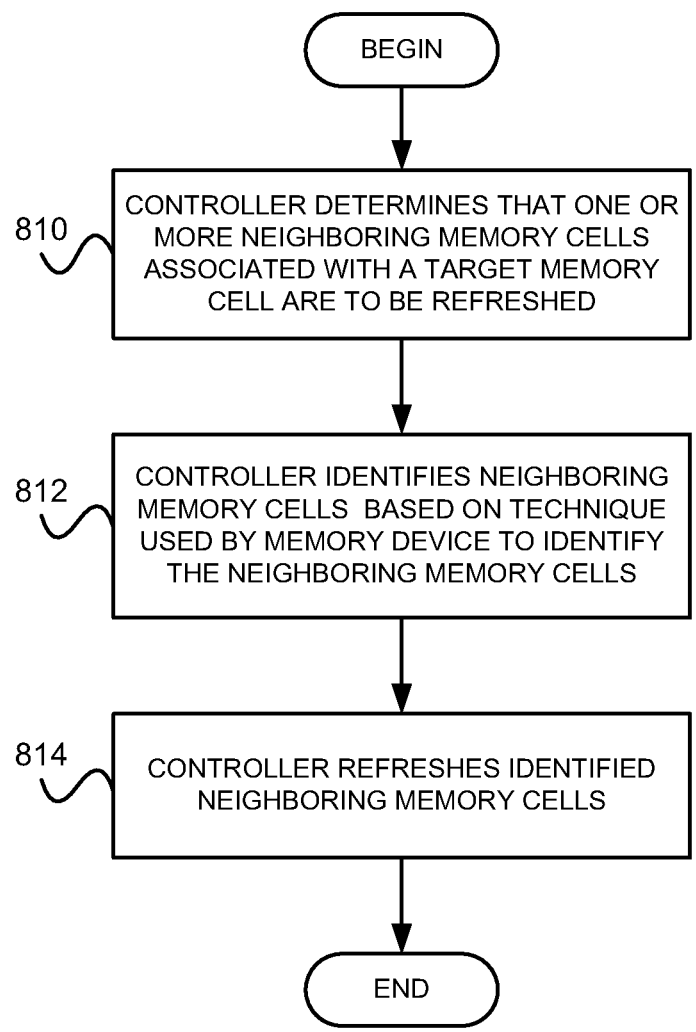

FIG. 8 illustrates another flow diagram of example acts that may be used to refresh one or more neighboring memory cells associated with a target memory cell. Referring to FIG. 8, at block 810, a controller may determine that neighboring memory cells associated with a target memory cell are to be refreshed. The controller may make the determination using various techniques, such as described above.

At block 812, the controller may identify neighboring memory cells based on a technique that may be used by a memory device containing the target memory cell to identify the neighboring memory cells. For example, suppose controller 220 has determined that neighboring memory cells associated with a target memory cell in memory device 300a are to be refreshed. Controller 220 may identify the addresses of the neighboring memory cells using a technique that may be employed by memory device 300a to identify the neighboring memory cells.

At block 814, the controller refreshes the identified memory cells. For example, continuing the above example, controller 220 rewrite information contained in the identified addresses of the neighboring memory cells, such as described above.

The foregoing description of embodiments is intended to provide illustration and description, but is not intended to be exhaustive or to limit the invention to the precise form disclosed. Modifications and variations are possible in light of the above teachings or may be acquired from practice of the invention. For example, while a series of acts has been described above with respect to FIGS. 5 through 8, the order of the acts may be modified in other implementations. Further, non-dependent acts may be performed in parallel.

Also, the term "user", as used herein, is intended to be broadly interpreted to include, for example, a computing device (e.g., fixed computing device, mobile computing device) or a user of a computing device, unless otherwise stated.

It will be apparent that one or more embodiments, described herein, may be implemented in many different forms of software and/or hardware. Software code and/or specialized hardware used to implement embodiments described herein is not limiting of the invention. Thus, the operation and behavior of embodiments were described without reference to the specific software code and/or specialized hardware—it being understood that one would be able to design software and/or hardware to implement the embodiments based on the description herein.

Further, certain features of the invention may be implemented using computer-executable instructions that may be executed by processing logic, such as, for example, device processing logic 224. The computer-executable instructions may be stored on one or more non-transitory tangible computer-readable storage media, such as, for example local storage 226. The media may be volatile or non-volatile and may include, for example, DRAM, SRAM, flash memories, removable disks, non-removable disks, and so on.

No element, act, or instruction used herein should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

It is intended that the invention not be limited to the particular embodiments disclosed above, but that the invention will include any and all particular embodiments and equivalents falling within the scope of the following appended claims.

What is claimed is:

1. A method comprising:
   determining, by processing logic, that one or more neighboring memory cells associated with a target memory cell are to be refreshed;
   generating a command associated with refreshing the one or more neighboring memory cells, the command including an identifier that identifies the target memory cell; and
   sending the command to a memory device that includes the target memory cell and the one or more neighboring memory cells.

2. The method of claim 1, wherein the command to direct the memory device to refresh the one or more neighboring memory cells.

3. The method of claim 1, wherein the command to direct the memory device to return one or more addresses associated with the one or more neighboring memory cells.

4. The method of claim 3, further comprising:
   receiving the one or more addresses associated with the one or more neighboring memory cells from the memory device responsive to the memory device receiving the command.

5. The method of claim 4, further comprising:
   causing the one or more neighboring memory cells associated with the received one or more addresses to be refreshed.

6. The method of claim 4, wherein the one or more neighboring memory cells associated with the received one or more addresses are refreshed by rewriting the one or more neighboring memory cells with information that is stored in the one or more neighboring memory cells.

7. The method of claim 1, wherein the determining further comprises:
   generating a random number for an access of the target memory cell;
   determining whether the generated random number matches a predefined number; and
   causing the one or more neighboring memory cells to be refreshed if the generated random number matches the predefined number.

8. The method of claim 1, wherein the determining further comprises:
   maintaining a count associated with accessing the target memory cell;
   determining whether the maintained count matches a predefined count; and causing the one or more neighboring memory cells to be refreshed if the maintained count matches the predefined count.

9. At least one non-transitory machine readable medium comprising a plurality of instructions that in response to being executed by a system cause the system to:
   determine that one or more neighboring memory cells associated with a target memory cell are to be refreshed;
   generate a command associated with refreshing the one or more neighboring memory cells, the command including an identifier that identifies the target memory cell; and
   send the command to a memory device that includes the target memory cell and the one or more neighboring memory cells.

10. The at least one non-transitory machine readable medium of claim 9, wherein the command to direct the memory device to refresh the one or more neighboring memory cells.

11. The at least one non-transitory machine readable medium of claim 9, wherein the command to direct the memory device to return one or more addresses associated with the one or more neighboring memory cells.

12. The at least one non-transitory machine readable medium of claim 11, the instructions to further cause the system to:
   receive the one or more addresses associated with the one or more neighboring memory cells from the memory device responsive to the memory device receiving the command.

13. The at least one non-transitory machine readable medium of claim 12, the instructions to further cause the system to:
   cause the one or more neighboring memory cells associated with the received one or more addresses to be refreshed.

14. The at least one non-transitory machine readable medium of claim 13, comprising the instructions to further cause the system to:
   cause the one or more neighboring memory cells associated with the received one or more addresses to be refreshed via a rewrite of the one or more neighboring memory cells with information that is stored in the one or more neighboring memory cells.

15. The at least one non-transitory machine readable medium of claim 9, the instructions to cause the system to determine that one or more neighboring memory cells associated with a target memory cell are to be refreshed further comprises the system to:
   generate a random number for an access of the target memory cell;
   determine whether the generated random number matches a predefined number;
   and cause the one or more neighboring memory cells to be refreshed if the generated random number matches the predefined number.

16. The at least one non-transitory machine readable medium of claim 9, the instructions to cause the system to determine that one or more neighboring memory cells associated with a target memory cell are to be refreshed further comprises the system to:
   maintain a count associated with accessing the target memory cell;
   determine whether the maintained count matches a predefined count; and
   cause the one or more neighboring memory cells to be refreshed if the maintained count matches the predefined count.

17. An apparatus comprising:
   a command bus interface; and
   a controller to include processing logic, the processing logic to:
      determine that one or more neighboring memory cells associated with a target memory cell are to be refreshed;
      generate a command associated with refreshing the one or more neighboring memory cells, the command including an identifier that identifies the target memory cell; and
      send the command to a memory device through the command bus interface, the command to include the target memory cell and the one or more neighboring memory cells.

18. The apparatus of claim 17, wherein the command to direct the memory device to refresh the one or more neighboring memory cells.

19. The apparatus of claim 17, wherein the command to direct the memory device to return one or more addresses associated with the one or more neighboring memory cells.

20. The apparatus of claim 19, wherein the processing logic to further:
   receive the one or more addresses associated with the one or more neighboring memory cells from the memory device responsive to the memory device receiving the command.

21. The apparatus of claim 20, wherein the processing logic to further:
   cause the one or more neighboring memory cells associated with the received one or more addresses to be refreshed.

22. The apparatus of claim 20, wherein the processing logic to further:
   cause the one or more neighboring memory cells associated with the received one or more addresses to be refreshed via a rewrite of the one or more neighboring memory cells with information that is stored in the one or more neighboring memory cells.

23. The apparatus of claim 17, wherein the processing logic to determine that one or more neighboring memory cells associated with a target memory cell are to be refreshed further comprises:
   generate a random number for an access of the target memory cell;
   determine whether the generated random number matches a predefined number; and
   cause the one or more neighboring memory cells to be refreshed if the generated random number matches the predefined number.

24. The apparatus of claim 17, wherein the processing logic to determine that one or more neighboring memory cells associated with a target memory cell are to be refreshed further comprises:
   maintain a count associated with accessing the target memory cell;
   determine whether the maintained count matches a predefined count; and
   cause the one or more neighboring memory cells to be refreshed if the maintained count matches the predefined count.

25. A system comprising:
   a memory device; and a controller to include processing logic, the processing logic to:
  determine that one or more neighboring memory cells associated with a target memory cell are to be refreshed;
  generate a command associated with refreshing the one or more neighboring memory cells, the command including an identifier that identifies the target memory cell; and
  send the command to a memory device, the command to include the target memory cell and the one or more neighboring memory cells.

26. The system of claim 25, wherein the command to cause the memory device to refresh the one or more neighboring memory cells.

27. The system of claim 25, wherein the command to cause the memory device to return one or more addresses associated with the one or more neighboring memory cells.

28. The system of claim 25, wherein the memory device further comprises one or more memory arrays that include volatile memory or non-volatile memory.

* * * * *